United States Patent
Higuchi et al.

(10) Patent No.: US 9,608,191 B2
(45) Date of Patent: Mar. 28, 2017

(54) SUBSTRATE FOR SUPERCONDUCTOR THIN FILM, SUPERCONDUCTOR THIN FILM, AND METHOD FOR PRODUCING SUBSTRATE FOR SUPERCONDUCTOR THIN FILM

(75) Inventors: Masaru Higuchi, Tokyo (JP); Hisaki Sakamoto, Tokyo (JP); Yoshinori Nagasu, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 13/814,595

(22) PCT Filed: Jul. 2, 2012

(86) PCT No.: PCT/JP2012/066904
§ 371 (c)(1),
(2), (4) Date: Feb. 6, 2013

(87) PCT Pub. No.: WO2013/002410
PCT Pub. Date: Jan. 3, 2013

(65) Prior Publication Data
US 2013/0137581 A1     May 30, 2013

(30) Foreign Application Priority Data
Jun. 30, 2011 (JP) .................... 2011-146162

(51) Int. Cl.
H01L 39/08 (2006.01)
H01L 39/02 (2006.01)
(Continued)

(52) U.S. Cl.
CPC .............. H01L 39/08 (2013.01); H01L 39/02 (2013.01); H01L 39/2454 (2013.01);
(Continued)

(58) Field of Classification Search
CPC ..... H01L 39/02; H01L 39/08; H01L 39/2454; H01B 12/06
See application file for complete search history.

(56) References Cited

U.S. PATENT DOCUMENTS

2005/0016867 A1   1/2005   Kreiskott et al.
2007/0173411 A1   7/2007   Ji et al.
(Continued)

FOREIGN PATENT DOCUMENTS

CN   101496118 A   7/2009
JP   5 250931      9/1993
(Continued)

OTHER PUBLICATIONS

Machine translation of JP 2008-311222 (2008).*
(Continued)

Primary Examiner — Paul Wartalowicz
(74) Attorney, Agent, or Firm — Oblon, McClelland, Maier & Neustadt, L.L.P.

(57) ABSTRACT

A superconducting thin film having excellent critical current characteristics is provided. A substrate for a superconducting thin film includes a substrate body (10A) having a main surface (10B) in which the root mean square slope RΔq of a roughness curve is 0.4 or less.

9 Claims, 4 Drawing Sheets

(51) Int. Cl.
    *H01L 39/24*    (2006.01)
    *H01B 12/06*    (2006.01)
(52) U.S. Cl.
    CPC .......... *H01B 12/06* (2013.01); *H01L 39/2461* (2013.01); *Y10T 428/24355* (2015.01)

(56) References Cited

U.S. PATENT DOCUMENTS

| | | | |
|---|---|---|---|
| 2008/0261059 A1 | 10/2008 | Kashima et al. | |
| 2008/0261072 A1 | 10/2008 | Kashima et al. | |
| 2011/0237441 A1* | 9/2011 | Baecker et al. | 505/150 |

FOREIGN PATENT DOCUMENTS

| | | | | |
|---|---|---|---|---|
| JP | 2007073327 A | 3/2007 | | |
| JP | 2008200773 A | 9/2008 | | |
| JP | 2008 266686 | 11/2008 | | |
| JP | 2008 269852 | 11/2008 | | |
| JP | 2008 311222 | 12/2008 | | |
| WO | WO 2010/058031 | * | 5/2010 | ............ H01L 39/24 |

OTHER PUBLICATIONS

International Search Report Issued Jul. 31, 2012 in PCT/JP12/66904 Filed Jul. 2, 2012.
Office Action issued Aug. 26, 2014, in Chinese Patent Application No. 201280002342.6 with English translation.
Extended European Search Report dated Nov. 7, 2014 issued in corresponding European patent application No. 12804747.9.
Kreiskott et al.—"Continuous electropolishing of Hastelloy substrates for ion-beam assisted deposition of MgO", Superconductor Science and Technology, vol. 16, No. 5, Jan. 1, 2003, pp. 613-616.
Office Action dated Jun. 21, 2016 issued in corresponding Japanese patent application No. 2012-552185 (English translation only).

* cited by examiner

SUBSTRATE FOR SUPERCONDUCTOR THIN FILM, SUPERCONDUCTOR THIN FILM, AND METHOD FOR PRODUCING SUBSTRATE FOR SUPERCONDUCTOR THIN FILM

CROSS REFERENCE TO RELATED APPLICATIONS

The present application is a 35 U.S.C. §371 national stage patent application of International patent application PCT/JP2012/066904, filed on Jul 2, 2012, published as WO 2013/002410 on Jan 3, 2013, the text of which is incorporated by reference, and claims the benefit of the filing date of Japanese application no. 2011-146162, filed on Jun 30, 2011, the text of which is also incorporated by reference.

TECHNICAL FIELD

The invention relates to a substrate for a superconducting thin film, a superconducting thin film, and a method for producing a substrate for a superconducting thin film.

BACKGROUND ART

There have been hitherto suggested a number of attempts to produce superconducting thin films by forming a superconducting layer by forming a film of an oxide superconductor on a substrate, and forming a stabilizing layer for protecting the superconducting layer or the like on the superconducting layer, in order to utilize the superconducting thin films in superconductor cables or superconductor magnets.

Among these, a superconductor wire which is obtained by forming a film on a long tape-shaped substrate by using an RE-based superconductor (RE: rare earth element) represented by the composition formula of $REBa_2Cu_3O_{7-\delta}$ as one of oxide superconductors that exhibit superconductivity at the liquid nitrogen temperature (77 K) or higher, can obtain high electric current characteristics, and therefore, such a superconductor is one of the superconducting thin films for which active research and development is currently in progress. Now, it has reached the state that production of a large number of trial products related to electric power equipment and the like using this superconducting thin film is underway.

It is known that the critical current characteristics ($I_c$ characteristics) in such a superconducting thin film are largely dependent on the orientation of crystals that constitute the oxide superconductor. This is because crystals of an oxide superconductor have electrical anisotropy, and it is easy to allow electricity to flow in the a-axis direction and the b-axis direction of the crystals, but it is difficult to allow electricity to flow in the c-axis direction. Therefore, in order to obtain a superconducting thin film having excellent critical current characteristics, the superconducting crystals that form the superconducting thin film need to have satisfactory crystal orientation, and it is necessary to set the direction of the orientation such that the a-axis or the b-axis is in the direction for electricity flow, and the c-axis is in another direction.

In order to obtain such superconducting crystals having satisfactory crystal orientation, it is necessary that the degree of lattice mismatch between the superconducting crystals and an underlying substance be small, and the surface of the underlying substance be compact and smooth. Therefore, with regard to the underlying substance, one having a crystal structure with a small degree of lattice mismatch between the underlying substance and superconducting crystals needs to be selected, and the underlying substance itself also needs to have satisfactory crystal orientation.

In order to obtain superconducting crystals having satisfactory crystal orientation, various configurations of underlying layers and various methods for forming an underlying layer have been hitherto attempted. Representative methods include, for example, a surface oxidation epitaxy (SOE) method, an ion beam assisted deposition (IBAD) method, and a RABiTS (Rolling-Assisted Biaxially Textured Substrate) method. For example, according to an example of the configuration of an underlying layer obtained by using an IBAD method, a $Gd_2Zr_2O_7$ layer, a MgO layer, a $LaMnO_3$ layer, and a $CeO_2$ layer are disposed in this order on a low-magnetic, non-oriented metal substrate (for example, HASTELLOY (registered trademark, manufactured by Haynes International, Inc.)), which is a nickel-based heat-resistant, corrosion-resistant alloy, and this may be used as an underlying layer. Here, the IBAD method is used when MgO is laminated.

The roles of the respective layers are as follows. The $Gd_2Zr_2O_7$ layer prevents diffusion of the elements of the metal substrate and suppresses the generation of reaction products between the elements of the metal substrate and the upper layers formed on the $Gd_2Zr_2O_7$ layer among the laminated underlying layers (for example, the MgO layer, the $LaMnO_3$ layer, and the $CeO_2$ layer). The MgO layer is forcibly oriented by the IBAD method and serves as a base of the orientation of the upper layers. The $LaMnO_3$ layer plays the role of buffering the degree of lattice mismatch between the MgO layer and the $CeO_2$ layer. The $CeO_2$ layer, which is the uppermost layer of the underlying layers, has a small degree of lattice mismatch with the crystals of an RE-based superconductor, and therefore, the $CeO_2$ layer is suitable as an underlying substance for producing an RE-based superconductor having satisfactory crystal orientation.

In view of the configuration and roles of the underlying layers as described above, it is obvious that the surface texture of the substrate affects the orientation of the underlying layers and the RE-based superconductor formed on the substrate. That is, when the surface roughness of the substrate is high, the surface irregularities increase in all of the underlying layers formed on the substrate, and consequently, satisfactory crystal orientation cannot be obtained.

Thus, Patent Document 1 (Japanese Patent Application Laid-Open (JP-A) No. 5-250931) discloses a superconducting thin film that includes a superconducting layer of an oxide having excellent crystal orientation and is capable of reducing the thickness of intermediate layers, by using a smoothened long substrate having a surface roughness Rmax of 0.05 μm an or less.

DISCLOSURE OF INVENTION

Technical Problem

However, the inventors of the invention conducted a thorough investigation, and as a result, it has been found that the management point for the surface texture of the substrate required to provide the underlying layers with favorable orientation does not reside in only the elevation difference of the undulations shown in the roughness curve. That is, it became clear that the root mean square slope $R\Delta q$ in the roughness curve also affects the crystal orientation of the underlying layers as well as the superconducting layer.

The invention has been made under such circumstances, and it is an object of the invention to provide a substrate for a superconducting thin film, which is suitable for producing a superconducting thin film having excellent critical current characteristics, a superconducting thin film using this substrate, and a method for producing a substrate for a superconducting thin film.

Solution to Problem

The above-described objects of the invention were solved by the means described below.

<1> A substrate for a superconducting thin film, the substrate including a substrate body having a main surface in which a root mean square slope RΔq of a roughness curve is 0.4 or less.

<2> The substrate for a superconducting thin film as described in the item <1>, wherein the root mean square slope RΔq of the roughness curve of the main surface is 0.32 or less.

<3> The substrate for a superconducting thin film as described in the item <2>, wherein the root mean square slope RΔq of the roughness curve of the main surface is 0.12 or less.

<4> The substrate for a superconducting thin film as described in any one of the items <1> to <3>, wherein an arithmetic mean roughness Ra of the roughness curve of the main surface is 10 nm or less.

<5> A superconducting thin film including the substrate for a superconducting thin film described in any one of the items <1> to <4>, and a superconducting layer that is formed on the main surface and contains an oxide superconductor as a main component.

<6> The superconducting thin film as described in the item <5>, further including an intermediate layer formed between the substrate for a superconducting thin film and the superconducting layer.

<7> A method for producing a substrate for a superconducting thin film, the method including, in the following order, a step of providing a metal substrate body; a step of subjecting the main surface of the metal substrate body on a side where a film of an oxide superconductor is to be formed, to polishing with abrasive particles; and a step of electrolytic polishing the main surface by allowing an electric current for from 15 seconds to 60 seconds at a current density of from 15 A/dm$^2$ to 30 A/dm$^2$ in an electrolytic solution in which the metal substrate body is immersed.

Advantageous Effects of Invention

According to the invention, a substrate for a superconducting thin film suitable for producing a superconducting thin film having excellent critical current characteristics, a superconducting thin film using this substrate, and a method for producing a substrate for a superconducting thin film can be provided.

BEST MODE FOR CARRYING OUT THE INVENTION

Figure 1:
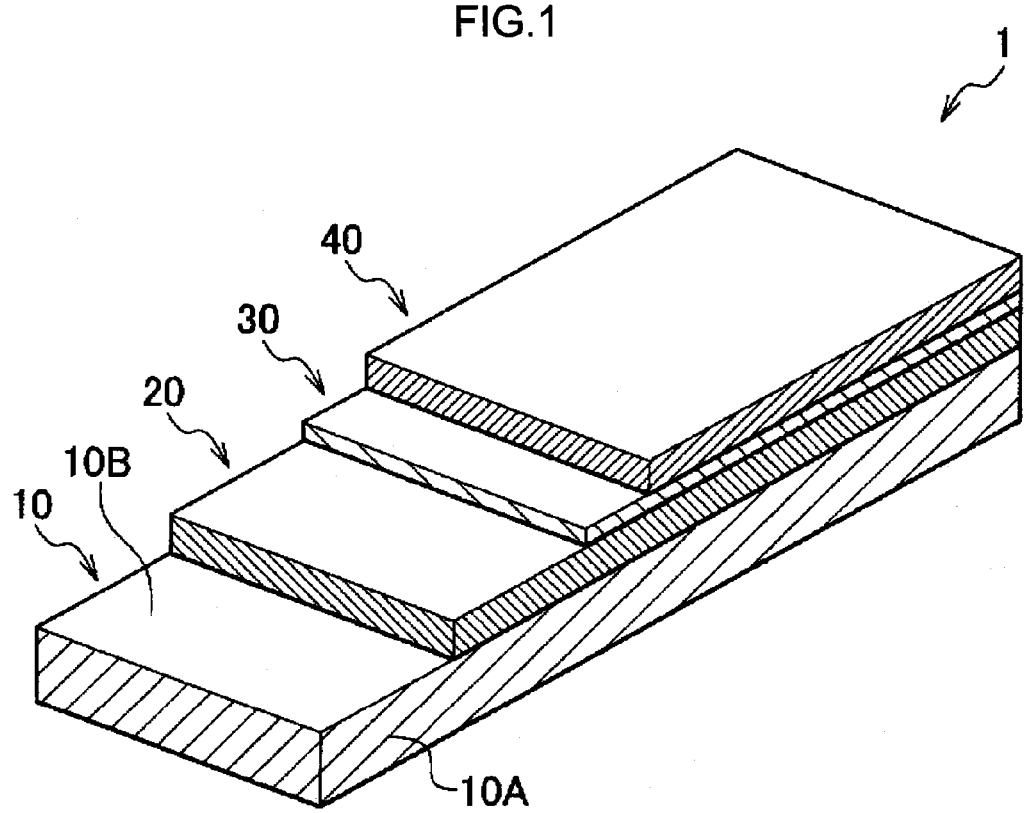
FIG. 1 illustrates a diagram illustrating the layered structure of a superconducting thin film 1 according to an exemplary embodiment of the invention.

Hereinafter, the substrate for a superconducting thin film, the superconducting thin film, and the method for producing a substrate for a superconducting thin film according to exemplary embodiments of the invention will be described specifically with reference to the attached drawings. Meanwhile, in the drawings, the members (constituent elements) having the same or equivalent functions are denoted with the same reference numeral, and further explanations are not repeated appropriately.

<Outline Configuration of Superconducting Thin Film>

FIG. 1 is a diagram illustrating the layered structure of a superconducting thin film 1 according to an exemplary embodiment of the invention.

As illustrated in FIG. 1, the superconducting thin film 1 has a layered structure in which an intermediate layer 20, a superconducting layer 30, and a stabilizing layer (protective layer) 40 are formed in this order on a long tape-shaped substrate 10 for a superconducting thin film (hereinafter, may also be referred to as substrate 10).

The substrate 10 for a superconducting thin film according to an exemplary embodiment of the invention includes a substrate body 10A having a main surface 10B in which the root mean square slope RΔq of a roughness curve for a surface where a thin film is formed (surface where an intermediate layer 20 is formed in FIG. 1) is 0.4 or less.

Figure 2:
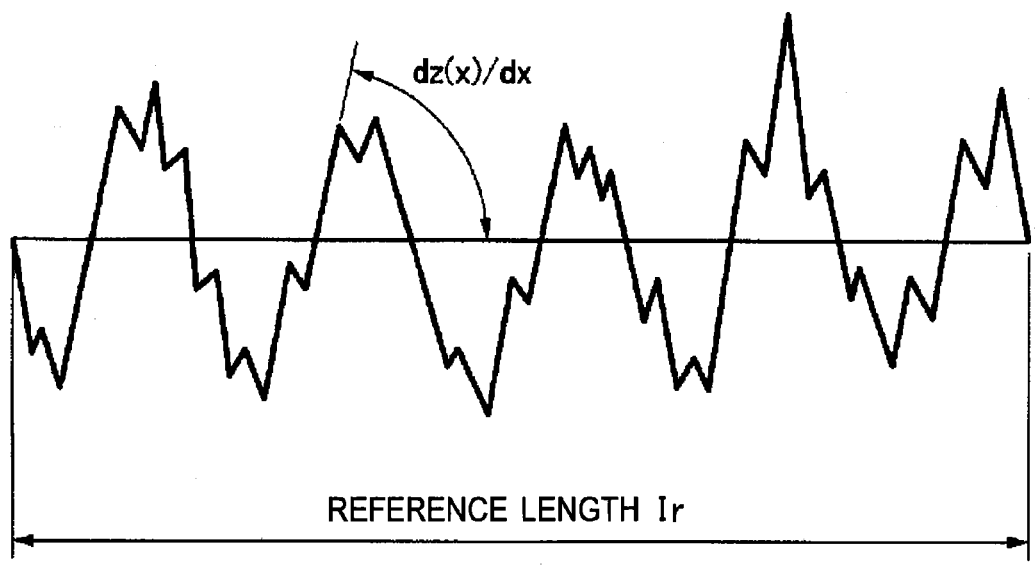
FIG. 2 illustrates a schematic diagram for explaining the root mean square slope.

Here, FIG. 2 is a schematic diagram for explaining the root mean square slope. The root mean square slope RΔq of the roughness curve described above is a parameter that can be determined by averaging the slope of surface irregularities in a microscopic range, and is represented by the following formula (1):

$$R\Delta q = \sqrt{\frac{1}{lr} \int_0^{lr} \left(\frac{d}{dx} Z(x)\right)^2 dx} \quad (1)$$

In formula (1), lr represents the reference length, and Z(x) represents the height of the roughness curve at the position x.

RΔq represented by such formula (1) is correlated to the crystal orientation of the thin film that is formed on the main surface 10B. Specifically, as the value of RΔq is smaller, the crystal orientation of the intermediate layer 20, the superconducting layer 30 and the like that are formed on the substrate 10 for a superconducting thin film is improved, and furthermore, the critical current characteristics of the superconducting thin film 1 are enhanced.

Meanwhile, the reason why the RΔq is set to 0.4 or less is to maintain the critical current characteristics as high as about 250 A or greater, and to avoid a rapid decrease in the critical current characteristics. Furthermore, from the viewpoint that the critical current characteristics are increased linearly, RΔq is preferably 0.32 or less. Furthermore, from the viewpoint that the critical current characteristics are enhanced more rapidly, R$\Delta$q is more preferably 0.12 or less. Still furthermore, from the viewpoint of eliminating the surface irregularities of the main surface 10B, it is preferable that R$\Delta$q is closer to zero (0), and it is preferable that R$\Delta$q is substantially zero. However, from the viewpoint that the adhesive strength between the substrate and the intermediate layer that is formed immediately above the substrate is decreased, R$\Delta$q is preferably 0.01 or greater.

The arithmetic mean roughness Ra of a roughness curve for the main surface 10B is not particularly limited in the present exemplary embodiment, but in order to suppress the influence on the critical current characteristics, it is preferable that the arithmetic mean roughness be smaller similarly to the case of R$\Delta$q. Specifically, Ra is preferably 10 nm or less, and more preferably 5.0 nm or less. Also, from the viewpoint that the critical current characteristics are further enhanced by a combination with R$\Delta$q, it is most preferable that Ra be 2.0 nm or less.

Figure 3:
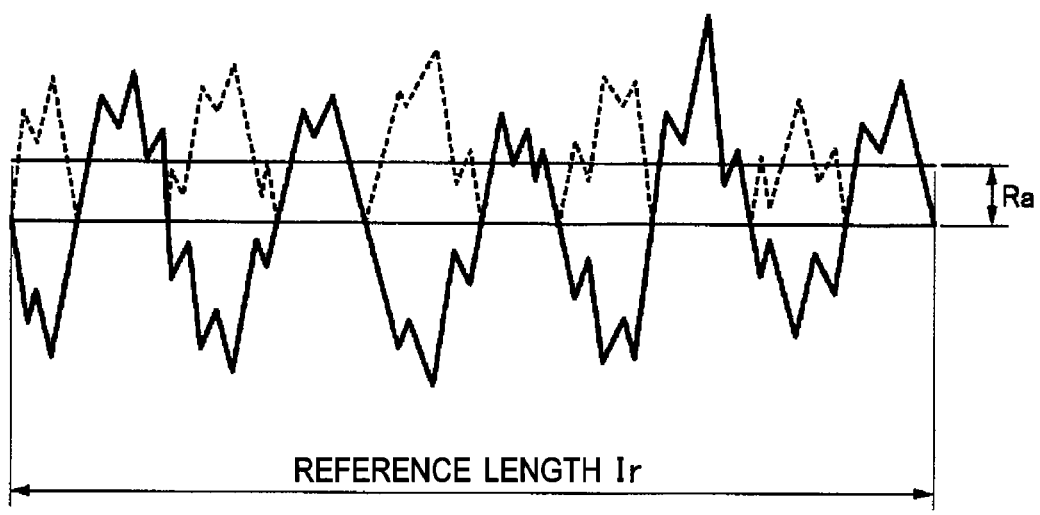
FIG. 3 illustrates a diagram for explaining the arithmetic mean roughness Ra.

Here, FIG. 3 is a diagram for explaining the arithmetic mean roughness Ra. The arithmetic mean roughness Ra is, as illustrated by the following formula (2), an average value of the absolute values of Z(x) for a reference length, and a smaller value of Ra means higher smoothness.

$$Ra = \frac{1}{lr} \int_0^{lr} |Z(x)| dx \quad (2)$$

In formula (2), lr represents the reference length, and Z(x) represents the height of the roughness curve at the position x.

Meanwhile, R$\Delta$q of formula (1) and Ra of formula (2) are such that, although along with an increase in Ra, R$\Delta$q may also increase at the same time, there is no correlation in principle, and defining Ra only does not determine the value of R$\Delta$q. Furthermore, in a case where R$\Delta$q is large even if Ra is small, the crystal orientation of the intermediate layer 20 or the superconducting layer 30 is not enhanced, and it is difficult to produce a superconducting thin film having excellent critical current characteristics.

The substrate body 10A is composed of any of a non-oriented material or an oriented material, and is composed of, for example, a material of a metal, a metal oxide or a ceramic. In regard to the shape of the substrate body 10A, various shapes can be employed in addition to the long tape shape, on the premise of having a main surface; however, it is preferable to employ a rectangular flat plate shape, which allows easy handling.

Specific examples of the metal include iron-based alloys, nickel-based alloys (particularly, HASTELLOY), copper alloys, aluminum alloys, and composites thereof. Specific examples of the metal oxide include $Al_2O_3$ (aluminum oxide, particularly sapphire), (Zr, Y)$O_2$ (yittria-stabilized zirconia), $LaAlO_3$ (lanthanum aluminate), $SrTiO_3$ (strontium titanate), $(La_xSr_{1-x})(Al_xTa_{1-x})O_3$ (lanthanum-strontium-tantalum-aluminum oxide), $NdGaO_3$ (neodymium gallate), $YAlO_3$ (yttrium aluminate), MgO (magnesium oxide), $TiO_2$ (titania), and $BaTiO_3$ (barium titanate). Specific examples of the ceramic include silicon carbide and graphite.

Particularly, among these, it is preferable to employ a HASTELLOY substrate from the viewpoint of having excellent strength, heat resistance and corrosion resistance.

The intermediate layer 20 is a buffering layer formed on the substrate 10 for a superconducting thin film in order to realize high in-plane orientation in the superconducting layer 30, and the physical property values such as the thermal expansion ratio and the lattice constant indicate values that are intermediate between the substrate 10 for a superconducting thin film and the oxide superconductor that is a constituent component of the superconducting layer 30. Meanwhile, a specific layer configuration will be described below.

The superconducting layer 30 is formed on the intermediate layer 20, and contains an oxide superconductor, particularly a copper oxide superconductor, as a main component. Meanwhile, the "main component" refers to a component whose content is the largest among the constituent components contained in the superconducting layer 30, and a preferred content of the main component is 90% or greater.

As the copper oxide superconductor, a crystalline material represented by a composition formula such as $REBa_2Cu_3O_{7-\delta}$ (referred to as RE-123), $Bi_2Sr_2CaCu_2O_{8+\delta}$ (including a material doped with Pb at the Bi sites), $Bi_2Sr_2Ca_2Cu_3O_{10+\delta}$ (including a material doped with Pb at the Bi sites), $(La, Ba)_2CuO_{4-\delta}$, $(Ca, Sr)CuO_{2\ 31\ \delta}$ [wherein the Ca site may be replaced by Ba], $(Nd, Ce)_2CuO_{4-\delta}$, $(Cu, Mo)Sr_2(Ce, Y)_sCu_2O$ [referred to as (Cu, Mo)-12s2, wherein s=1, 2, 3 or 4], $Ba(Pb, Bi)O_3$, or $Tl_2Ba_2Ca_{n-1}Cu_nO_{2n+4}$ (wherein n represents an integer of 2 or greater) can be used. The copper oxide superconductor can be constituted of a combination of these crystalline materials.

Among the crystalline materials described above, a RE-based superconductor ($REBa_2Cu_3O_{7-\delta}$) is preferably used because the superconductor characteristics are satisfactory, and the crystal structure is simple. The crystalline material may be a polycrystalline material, or may be a single crystal material.

RE in the RE-based superconductor represents a single rare earth element such as Y, Nd, Sm, Eu, Gd, Dy, Ho, Er, Tm, Yb or Lu, or plural rare earth elements. Among these, RE is preferably Y for the reason that substitution at the Ba sites does not occur. $\delta$ represents the oxygen non-stoichiometric amount, which is, for example, from 0 to 1. From the viewpoint of obtaining a high superconducting transition temperature, it is more preferable that the value of $\delta$ is closer to 0. Meanwhile, the oxygen non-stoichiometric amount is such that if high pressure oxygen annealing or the like is carried out by using an apparatus such as an autoclave, $\delta$ may have a value less than 0, that is, a negative value.

Furthermore, $\delta$ of crystalline materials other than the RE-based superconductors also represents the oxygen non-stoichiometric amount, and is, for example, from 0 to 1.

The thickness of the superconducting layer 30 is not particularly limited, but for example, the thickness is from 500 nm to 3000 nm.

Examples of a method for forming (film-forming) the superconducting layer 30 include a TFA-MOD method, a PLD method, a CVD method, an MOCVD method, and a sputtering method. Among these film-forming methods, the MOCVD method is preferably used, from the viewpoint that a high vacuum is not required, film forming can be achieved even on a substrate 10 having a large-sized area and a complicated shape, and mass productivity is excellent.

On the surface of the superconducting layer 30 such as described above, for example, a stabilizing layer 40 formed of silver is formed by a sputtering method.

<Substrate for Superconducting Thin Film and Method for Production Thereof>

Figure 4:
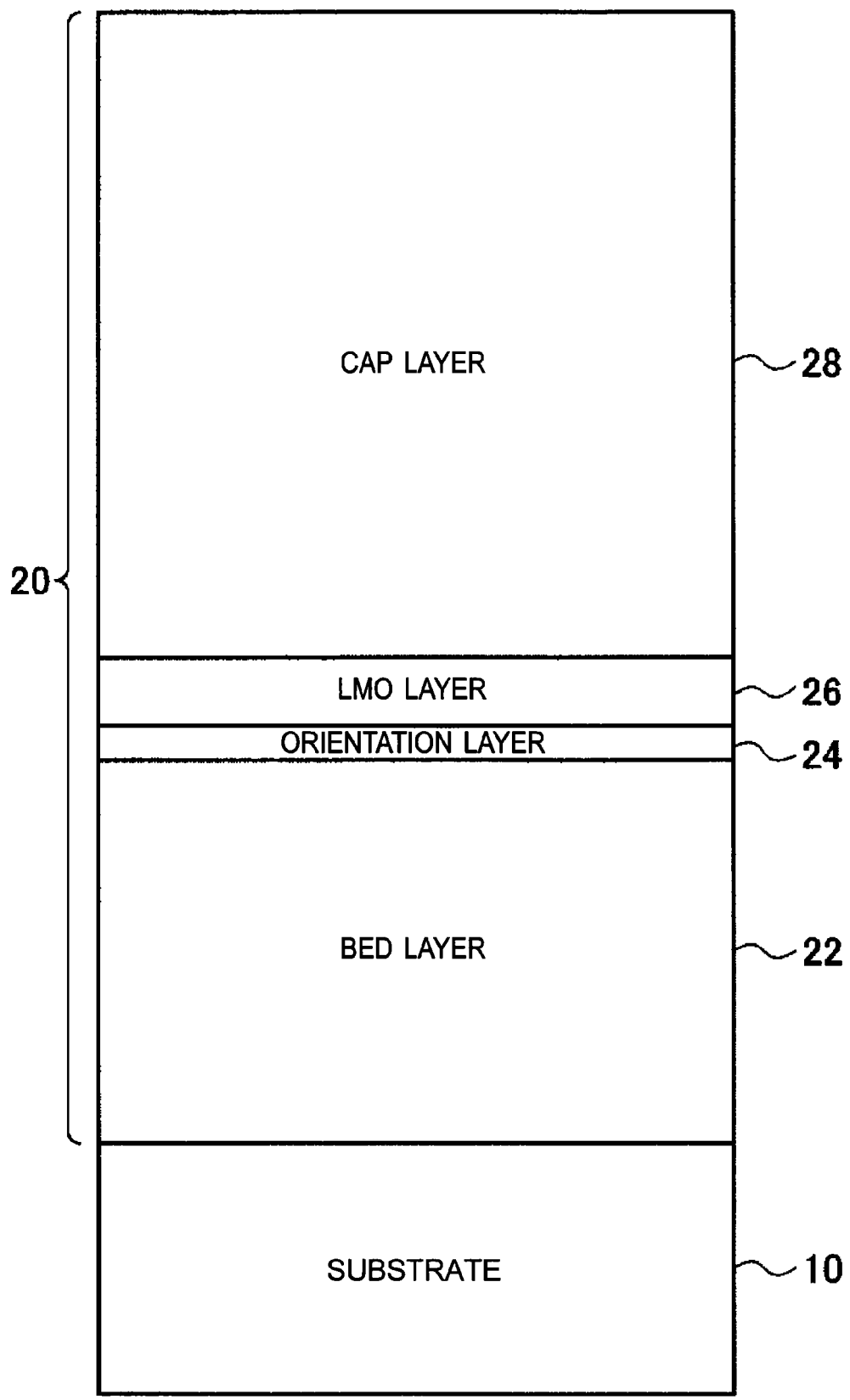
FIG. 4 illustrates a cross-sectional diagram illustrating the detailed configuration of an intermediate layer 20 of a superconducting thin film 1 according to an exemplary embodiment of the invention.

FIG. 4 is a cross-sectional diagram illustrating the detailed configuration of the substrate 10 and the intermediate layer 20 that are constituent members of a superconducting thin film 1 according to an exemplary embodiment of the invention.

As illustrated in FIG. 4, the intermediate layer 20 that is a constituent member of the superconducting thin film 1 has a configuration in which a bed layer 22, an orientation layer 24, an LMO layer 26, and a cap layer 28 are disposed in this order.

The bed layer 22 is a layer which is formed on the substrate 10 for a superconducting thin film, and is intended to prevent diffusion of the metal elements of the substrate 10 for a superconducting thin film and to enhance the biaxial orientation of the orientation layer 24. Furthermore, although this bed layer 22 is affected by the surface texture of the underlying substrate 10 for a superconducting thin film, since the root mean square slope R$\Delta$q of the substrate 10 for a superconducting thin film is small, there are no steep surface irregularities even at the surface of the bed layer 22 on the side of the orientation layer 24.

From the viewpoint of enhancing the biaxial orientation of the orientation layer 24, the bed layer 22 is preferably non-oriented, and at least during the production process for the orientation layer 24, it is preferable that the bed layer 22 be in an amorphous state, which leads to a non-oriented state.

The thickness of the bed layer 22 is not particularly limited; however, from the viewpoint of suppressing deterioration of the function of the bed layer 22 (suppression of the diffusion of metal elements from the substrate 10 for a superconducting thin film, and enhancement of the orientation of the orientation layer), the thickness is preferably 10 nm or greater, and from the viewpoint of suppressing warpage of the substrate 10 for a superconducting thin film, the thickness is preferably 500 nm or less. Particularly, from the viewpoint of further reducing the thickness by a requirement for cost or the like, the thickness is more preferably 100 nm or less.

Examples of a method for forming (film-forming) the bed layer 22 include a TFA-MOD method, a PLD method, a CVD method, an MOCVD method, and a sputtering method. Among them, the sputtering method is preferably used from the viewpoint that production is facilitated.

For the film-forming of the bed layer 22, an ion bean sputtering method in which ions generated by an ion generator (ion gun) are caused to collide with a deposition source, may also be utilized. Furthermore, the bed layer 22 can have a multilayer structure such as, for example, a bilayer structure of an $Y_2O_3$ layer and an $Al_2O_3$ layer.

The orientation layer 24 is a layer which is formed immediately above the bed layer 22, and is intended to orient the crystals of the superconducting layer 30 in a certain direction. Although this orientation layer 24 is affected by the surface texture of the underlying bed layer 22, since there are no steep surface irregularities at the surface of the bed layer 22, that is, since the value of R$\Delta$q of the bed layer 22 is small due to the surface texture of the substrate 10 for a superconducting thin film, the crystal orientation of the orientation layer 24 is enhanced as compared with the conventional cases.

Examples of the constituent material of the orientation layer 24 include polycrystalline materials such as NbO and MgO. Furthermore, the same material as that of the bed layer 22, for example, $Gd_2Zr_2O_7$, may also be used. Furthermore, there are no particular limitations on the thickness of the orientation layer 24, but for example, the thickness is from 1 nm to 20 nm.

Examples of a method for forming (film-forming) the orientation layer 24 include a method of forming a film by an IBAD method in an atmosphere of argon, oxygen, or a mixed gas of argon and oxygen. In the IBAD method, while an assist ion beam is irradiated on the film-forming surface from an oblique direction, the deposition particles ejected from a deposition source (MgO or the like) by RF sputtering (or ion beam sputtering) are deposited on the film-forming surface to form a film.

Meanwhile, for the film forming of the orientation layer 24, reactive sputtering may also be utilized, in which Mg for example is used as a deposition source, Mg is sputtered in an atmosphere of a mixed gas of argon and oxygen to allow the ejected Mg to react with oxygen, and thereby a film of MgO is formed. Furthermore, the orientation layer 24 may also be a composite layer including a layer formed by an epitaxial method, and a layer formed by IBAD.

The LMO layer 26 is disposed between the orientation layer 24 and the cap layer 28, and has a function of enhancing the lattice matching property of the cap layer 28. The LMO layer 26 is an oxide layer composed of a crystalline material represented by the composition formula: $LaMnO_{3+\delta}$ ($\delta$ represents the oxygen non-stoichiometric amount). Meanwhile, the value of $\delta$ is not particularly limited, but the value is, for example, $-1<\delta<1$. Although this LMO layer 26 is affected by the surface texture of the underlying orientation layer 24, since the crystal orientation of the orientation layer 24 is high, the crystal orientation of the LMO layer 24 is also enhanced as compared with the conventional cases.

Furthermore, the LMO layer 26 is preferably an oxide layer composed of a crystalline material represented by the composition formula: $La_z(Mn_{1-x}M_x)_wO_{3+\delta}$ (wherein M represents at least one selected from Cr, Al, Co and Ti; $\delta$ represents the oxygen non-stoichiometric amount; and $0<z/w<2$, and $0<x\leq1$), from the viewpoint that the phase transition temperature at which a cubic crystal lattice of LMO is obtained can be lowered.

There are no particular limitations on the thickness of the LMO layer 26, but from the viewpoint of suppressing the surface roughness of the LMO layer 26, the thickness is preferably 100 nm or less, and in view of production, the thickness is preferably 4 nm or greater. A specific value thereof may be 30 nm.

Examples of a method for forming (film-forming) the LMO layer 26 include a PLD method that is carried out while the substrate 10 for a superconducting thin film is heated, and film forming according to an RF sputtering method.

The cap layer 28 is a layer that is formed on the LMO layer 26 and is intended to protect the LMO layer 26 and also to further increase the lattice matching property with the superconducting layer 30. Although this cap layer 28 is affected by the surface texture of the underlying LMO layer 26, since the crystal orientation of the LMO layer is high, the crystal orientation of the cap layer 28 is also enhanced as compared with the conventional cases.

The cap layer 28 contains a rare earth element, and is composed of a substance which exhibits self-orientation. This substance is, for example, a substance selected from $CeO_2$ and $REMnO_3$, and is preferably $CeO_2$.

There are no particular limitations on the thickness of the cap layer 28, but in order to obtain sufficient orientation, the thickness is preferably 50 nm or greater, and more preferably 300 nm or greater. However, since the time period for film-forming increases if the thickness is greater than 600 nm, it is preferable to set the thickness to 600 nm or less.

Examples of a method for forming (film-forming) this cap layer 28 include film-forming according to a PLD method or an RF sputtering method.

<Method for Producing Substrate 10 for Superconducting Thin Film>

In general, substrates formed using a metal, including the substrate 10 for a superconducting thin film described above, are produced by rolling the material thereof. In the intermediate processes of rolling, surface defects attributable to the material defects may be eliminated by mechanical polishing or the like. Since a substrate that has been finally subjected to finish rolling with predetermined dimensions does not have a surface roughness that is sufficiently small to be supplied for the use in superconducting thin film production, the surface texture of the substrate is adjusted by precision polishing.

One of the methods for precision polishing may be polishing with abrasive particles. It is generally possible to finish with a surface roughness Ra of several nanometers, by selecting appropriate abrasive particles. However, in conventional polishing with abrasive particles, formation of fine surface irregularities attributable to the size of the abrasive particles cannot be avoided, and it is difficult to prevent the formation of steep undulations on the surface of the substrate.

Thus, in the method for producing the substrate 10 for superconducting thin film according to an exemplary embodiment of the invention, steep undulations on the surface of the metal substrate can be eliminated, that is, the root mean square slope RΔq of a roughness curve for the main surface 10B can be reduced to 0.4 or less, by adjusting the conditions for the polishing with abrasive particles to optimal conditions, or by further subjecting the metal substrate that has been polished with abrasive particles to electrolytic polishing.

Finish polishing using abrasive particles can be conducted by using a coil polishing machine, which is suitable for the polishing of long coil materials. Regarding the mode of polishing, polishing can be carried out in a multistage mode of a polishing unit using a buff tape and an abrasive. Polishing heads are rotated while flocked clothes or non-woven fabric tapes are fed, a long substrate is caused to travel between the polishing heads and supports, and polishing is carried out with a multistage head while an abrasive is supplied thereto.

For instance, an example of preferable conditions for finish polishing a HASTELLOY substrate may be such that as an abrasive for the first stage, an abrasive prepared by adding polycrystalline diamond abrasive particles having an average particle size of from 0.1 μm to 1.0 μm, and preferably 0.125 μm, to an aqueous solution containing a glycol compound, glycerin, a fatty acid and the like is used. As an abrasive for the second stage, an abrasive prepared by adding colloidal silica abrasive particles having an average particle size of from 0.01 μm to 0.05 μm, and preferably 0.03 μm, to an aqueous solution containing a water-soluble dispersant, ammonium oxalate, potassium oxalate and glycerin is used. As polishing conditions that do not form steep undulations, it is preferable to adjust the pressure applied to the supports to 5 kg or less, the speed of rotation of the polishing heads to 400 rpm or higher, and the travel speed of the substrate to 10 m/hr or less.

Electrolytic polishing is characterized by preferentially dissolving the convex areas at the surface of the metal substrate, and steep convex areas can be made gentle. As a method for electrolytic polishing, techniques equivalent to the electrolytic polishing methods that are generally carried out for the surface treatment of metals or the like are used, and electrolytic polishing can be carried out by adjusting the composition of the electrolytic liquid, the current density and the like to optimal conditions in accordance with the material quality of the substrate. For instance, an example of preferable conditions for electrolytically polishing a substrate formed of HASTELLOY, which is a Ni-based alloy, may be such that a general electrolytic solution for stainless steel may be used as the electrolytic solution. For example, a mixed liquid containing methanesulfonic acid and phosphoric acid as main components is used as the electrolytic solution, and the surface of the HASTELLOY substrate is electrolytically polished by allowing an electric current to flow for from 15 seconds to 60 seconds at a current density of from 15 $A/dm^2$ to 30 $A/dm^2$ in that electrolytic solution. More specifically, the HASTELLOY substrate is subjected to degreasing, water washing, acid washing, water washing, electrolytic polishing, water washing, acid washing, water washing, and drying in this order. Degreasing may be carried out by using a general alkali-based degreasing material, or electrolytic degreasing may be applied. Acid washing may be carried out by using, for example, a 10% sulfuric acid solution. Electrolytic polishing may be carried out more preferably for 45 seconds at a current density of 20 $A/dm^2$.

When the above-described method is used, the surface roughness Ra of the main surface 10B of the substrate body 10A is adjusted, and steep surface irregularities that are present on the main surface 10B and inhibit crystal orientation of the underlying layers are eliminated, that is, the root mean square slope RΔq in the roughness curve of the main surface 10B of the substrate body 10A becomes 0.4 or less. Therefore, underlying layers (intermediate layer 20) and a superconducting layer 30 that have satisfactory crystal orientation can be produced, and a superconducting thin film 1 having excellent critical current characteristics may be obtained.

Meanwhile, the arithmetic mean roughness Ra described above is the value obtained when measurement is made in a square region having a size of X×Y=1.54 μm×1.54 μm by using an atomic force microscope (AFM, NANOSURF® MOBILE S manufactured by Nanosurf AG). Furthermore, the root mean square slope RΔq is the value calculated from the AFM measurement data (data sampling interval: 0.006 μm).

<Modification Example>

Meanwhile, particular exemplary embodiments of the invention have been described in detail, but the invention is not intended to be limited to such exemplary embodiments, and it will be obvious to those skilled in the art that various other embodiments can be made within the scope of the invention. For example, plural exemplary embodiments described above can be carried out in appropriate combination. Furthermore, the following modification examples may also be appropriately combined.

For example, the various layers of the intermediate layer 20 can be entirely or partially omitted. On the contrary, layers other than those layers described above can also be added as parts of the intermediate layer 20.

The disclosure of Japanese Patent Application No. 2011-146162 is incorporated herein by reference in its entirety.

EXAMPLES

Hereinafter, the substrate for a superconducting thin film and the superconducting thin film according to the invention will be described by way of Examples, but the invention is not i limited by these Examples.

Example 1

In Example 1, HASTELLOY C-276 that had been rolled to a width of 1 cm and a thickness of 0.1 mm was used as a substrate for a superconducting thin film. One surface of this substrate was subjected to crude polishing by polishing with abrasive particles, and was further subjected to finish polishing by polishing with abrasive particles. Subsequently, further polishing was carried out by electrolytic polishing. Here, a substrate having a surface texture which exhibited $R\Delta q=0.09$ and $Ra=1.8$ nm was produced by adjusting the processing conditions for polishing. Meanwhile, Ra was measured in a square region having a size of $X \times Y=1.54$ μm×1.54 μm by using an atomic force microscope (AFM, NANOSURF® MOBILE S manufactured by Nanosurf AG). Furthermore, $R\Delta q$ was obtained by determining $R\Delta q$ values in the X-direction and the Y-direction, respectively, from the measured data of 256×256 points obtained from the AFM measurement data (data sampling interval: 0.006 μm), and calculating the average value. Thus, $R\Delta q=0.09$ was obtained.

Next, film-forming of underlying layers was carried out on the polished surface of the substrate. As the underlying layers (intermediate layers), a $Gd_2Zr_2O_7$ layer, an MgO layer, a $LaMnO_3$ layer, a $CeO_2$ layer were disposed in this order from the substrate side. Subsequently, film-forming of a superconducting layer (YBCO) was carried out on the surface of the underlying layers. The thickness of the superconducting layer was 1 μm. Subsequently, a film of silver was formed as a stabilizing layer on the surface of the superconducting layer. The thickness of the silver layer was 10 μm.

Thus, a superconducting thin film of Example 1 of the invention was obtained through the above-described procedure.

Examples 2 to 8

In Examples 2 to 8, substrates having a surface texture exhibiting $R\Delta q=0.10$ and $Ra=4.8$ nm (Example 2), $R\Delta q=0.10$ and $Ra=1.9$ nm (Example 3), $R\Delta q=0.11$ and $Ra=7.8$ nm (Example 4), $R\Delta q=0.14$ and $Ra=4.9$ nm (Example 5), $R\Delta q=0.15$ and $Ra=2.0$ nm (Example 6), $R\Delta q=0.17$ and $Ra=7.9$ nm (Example 7), and $R\Delta q=0.19$ and $Ra=2.1$ nm (Example 8), respectively, were produced in the same manner as in Example 1, by adjusting the processing conditions for polishing. Further, underlying layers, a superconducting layer and a stabilizing layer were formed on each of these substrates in the same manner as in Example 1, and thus superconducting thin films of Examples 2 to 8 of the invention were obtained.

Examples 9 to 15

In Examples 9 to 15, substrate having a surface texture exhibiting $R\Delta q=0.21$ and $Ra=5.0$ nm (Example 9), $R\Delta q=0.24$ and $Ra=2.0$ nm (Example 10), $R\Delta q=0.27$ and $Ra=8.0$ nm (Example 11), $R\Delta q=0.31$ and $Ra=1.9$ nm (Example 12), $R\Delta q=0.32$ and $Ra=5.1$ nm (Example 13), $R\Delta q=0.35$ and $Ra=2.2$ nm (Example 14), and $R\Delta q=0.39$ and $Ra=2.1$ nm (Example 15), respectively, were produced in the same manner as in Example 1, except that electrolytic polishing was omitted from the method of Example 1, by adjusting the processing conditions of polishing. Further, underlying layers, a superconducting layer and a stabilizing layer were formed on each of these substrates in the same manner as in Example 1, and thus superconducting thin films of Examples 9 to 15 of the invention were obtained.

Comparative Examples 1 to 4

In Comparative Examples 1 to 4, substrates having a surface texture exhibiting $R\Delta q=0.43$ and $Ra=2.0$ nm (Comparative Example 1), $R\Delta q=0.44$ and $Ra=5.0$ nm (Comparative Example 2), $R\Delta q=0.48$ and $Ra=2.0$ nm (Comparative Example 3), and $R\Delta q=0.55$ and $Ra=8.0$ nm (Comparative Example 4), respectively, were produced in the same manner as in Example 1, except that electrolytic polishing was omitted from the method of Example 1, by adjusting the processing conditions of polishing. Furthermore, underlying layers, a superconducting layer and a stabilizing layer were formed on each of these substrates in the same manner as in Example 1, and thus superconducting thin films of Comparative Examples 1 to 4 of the invention were obtained.

Specific production conditions of the various Examples and Comparative Examples will be described in the following Table 1.

TABLE 1

| | Conditions for polishing with abrasive particles | | | Conditions for electrolytic polishing | |
|---|---|---|---|---|---|
| | Applied pressure (Kg) | Speed of rotation (rpm) | Speed of substrate (m/h) | Current density (A/dm$^2$) | Time(s) |
| Example 1 | 5 | 500 | 5 | 20 | 45 |
| Example 2 | 5 | 450 | 7.5 | 20 | 30 |
| Example 3 | 5 | 500 | 5 | 20 | 60 |
| Example 4 | 5 | 400 | 10 | 25 | 45 |
| Example 5 | 5 | 450 | 7.5 | 25 | 30 |
| Example 6 | 5 | 500 | 5 | 20 | 15 |
| Example 7 | 5 | 400 | 10 | 15 | 60 |
| Example 8 | 5 | 500 | 5 | 30 | 45 |
| Example 9 | 5 | 450 | 7.5 | None | None |
| Example 10 | 5 | 500 | 5 | None | None |
| Example 11 | 5 | 400 | 10 | None | None |
| Example 12 | 5 | 500 | 5 | None | None |
| Example 13 | 5 | 450 | 7.5 | None | None |
| Example 14 | 5 | 500 | 5 | None | None |
| Example 15 | 5 | 500 | 5 | None | None |
| Comparative Example 1 | 7 | 250 | 10 | None | None |
| Comparative Example 2 | 10 | 250 | 20 | None | None |
| Comparative Example 3 | 7 | 250 | 15 | None | None |
| Comparative Example 4 | 12 | 250 | 50 | None | None |

<Evaluation Method>

The in-plane orientation $\Delta\phi$ of the (100) plane of $CeO_2$, which is an underlying layer, was measured by $\phi$ scan of an X-ray diffraction method, in the state before the superconducting layer was formed in Examples 1 to 15 and Comparative Examples 1 to 4. The in-plane orientation $\Delta\phi$ of the (100) plane was determined based on the full width at half maximum of the X-ray diffraction peaks of $\phi$ scan of the (111) plane as a corresponding plane. That is, a sample was fixed at 55°, which is a measurement angle of the (111) plane of $CeO_2$, and the values of the full-width at half maximum of the subject peak obtained four times by rotating the sample from 0° to 360° were averaged.

Next, the critical currents Ic of the superconducting thin films obtained in Examples 1 to 15 and Comparative Examples 1 to 4 were measured. Specifically, the critical current Ic was measured by using a four-terminal method while the superconducting thin film material was immersed in liquid nitrogen. The voltage terminal was set to 1 cm, and the electric field criterion was set to 1 μV/cm.

<Measurement Results>

The results of the in-plane orientation $\Delta\phi$ of the various underlying layers and the critical current Ic of the various superconducting thin films measured by using the evaluation methods described above are summarized in the following Table 2. Furthermore, in FIG. 5, the relationship between RΔq and Ic(A) obtained by the measurement are plotted.

TABLE 2

|  | RΔq | Ra(nm) | $\Delta\phi$ (°) | Ic(A) |
|---|---|---|---|---|
| Example 1 | 0.09 | 1.8 | 3.9 | 354 |
| Example 2 | 0.10 | 4.8 | 4.1 | 345 |
| Example 3 | 0.10 | 1.9 | 4.0 | 349 |
| Example 4 | 0.11 | 7.8 | 4.4 | 338 |
| Example 5 | 0.14 | 4.9 | 4.5 | 332 |
| Example 6 | 0.15 | 2.0 | 4.5 | 335 |
| Example 7 | 0.17 | 7.9 | 5.2 | 311 |
| Example 8 | 0.19 | 2.1 | 5.0 | 320 |
| Example 9 | 0.21 | 5.0 | 5.3 | 310 |
| Example 10 | 0.24 | 2.0 | 5.4 | 305 |
| Example 11 | 0.27 | 8.0 | 6.0 | 290 |
| Example 12 | 0.31 | 1.9 | 5.9 | 291 |
| Example 13 | 0.32 | 5.1 | 6.4 | 277 |
| Example 14 | 0.35 | 2.2 | 6.6 | 270 |
| Example 15 | 0.39 | 2.1 | 6.8 | 263 |
| Comparative Example 1 | 0.43 | 2.0 | 7.3 | 222 |
| Comparative Example 2 | 0.44 | 5.0 | 8.1 | 197 |
| Comparative Example 3 | 0.48 | 2.0 | 7.8 | 204 |
| Comparative Example 4 | 0.55 | 8.0 | 9.6 | 125 |

Figure 5:
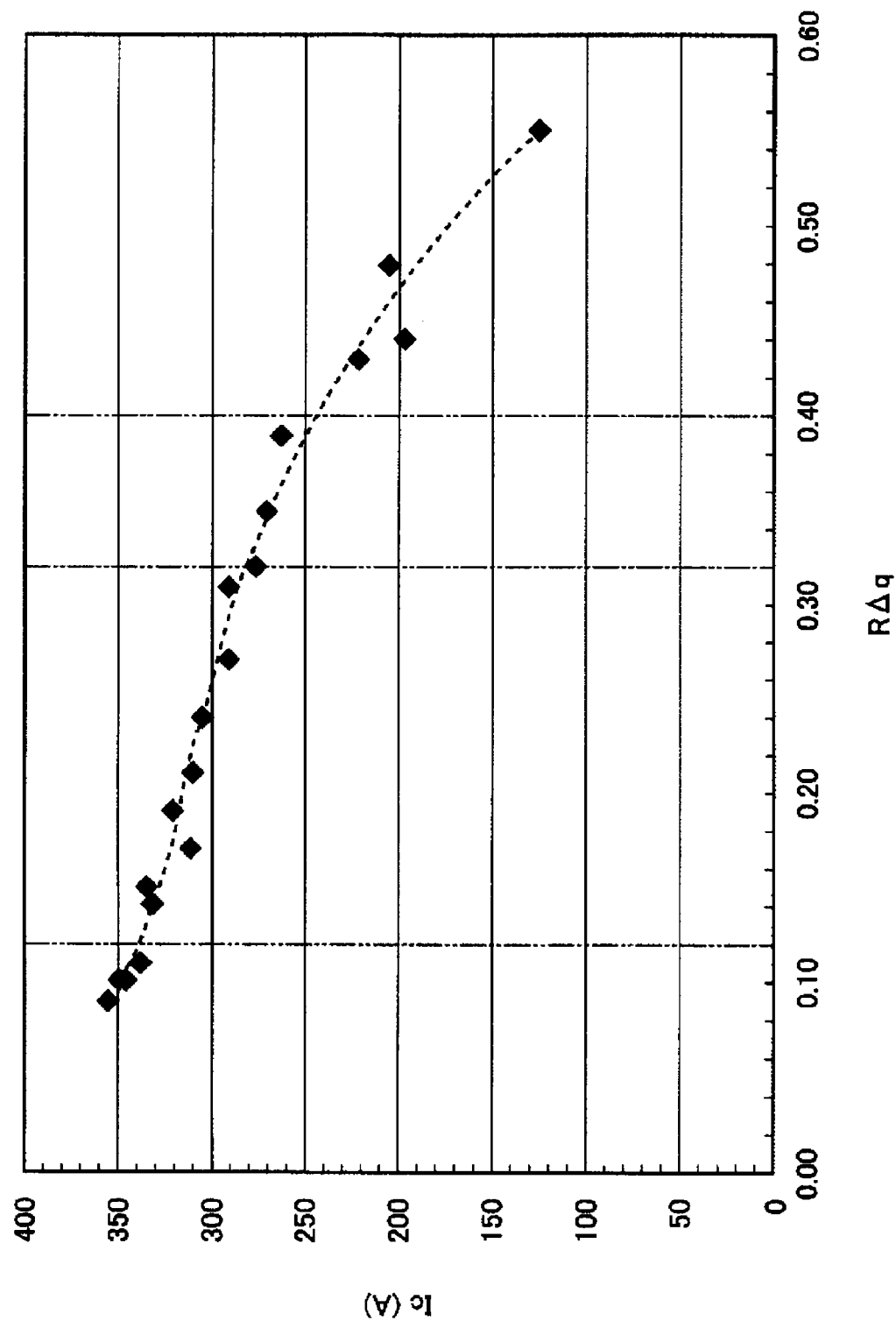
FIG. 5 illustrates a graph illustrating the relationship between RΔq and Ic(A) obtained by measurement in the superconducting thin films according to Examples 1 to 15 and Comparative Examples 1 to 4.

As illustrated in Table 2 and FIG. 5, it was found that when RΔq was greater than 0.4, Ic tended to rapidly decrease. On the contrary, it was found that when RΔq was 0.4 or less, Ic was in a state of being as high as 250 A or greater. Also, it was found that when RΔq was in the range of 0.4 or less, as RΔq decreased, the critical current characteristics (Ic) were enhanced.

Particularly, from the viewpoint that when RΔq was greater than 0.32, the critical current characteristics were enhanced linearly as RΔq decreased, it was found that this RΔq was preferably 0.32 or less.

Furthermore, from the viewpoint that when RΔq was greater than 0.12, the critical current characteristics were more rapidly enhanced, it was found that this RΔq was preferably 0.12 or less.

Furthermore, the relationship between RΔq and $\Delta\phi$ correlates with the relationship between RΔq and Ic. The results described above was also verified from the relationship between RΔq and $\Delta\phi$.

Furthermore, it was found that Ra was 10 nm or less in all of the Examples and Comparative Examples. The results for Example 2 and Example 3 show that even though the values of RΔq are equal, if the values of Ra are different, the values of $\Delta\phi$ or Ic are different. However, even if the values of Ra are greatly different such as 4.8 nm and 1.9 nm, the differences in $\Delta\phi$ or Ic are small, and, therefore, it is speculated that RΔq contributes to $\Delta\phi$ or Ic more than Ra does.

Therefore, it is considered that in order to produce a superconducting thin film having excellent critical current characteristics, it is effective to adjust RΔq first rather than Ra.

Reference numeral 1 represents a superconducting thin film.

Reference numeral 10 represents a substrate for a superconducting thin film.

Reference numeral 10A represents a substrate body.
Reference numeral 10B represents a main surface.
Reference numeral 20 represents an intermediate layer.
Reference numeral 30 represents a superconducting layer.

The invention claimed is:

1. A superconducting thin film, comprising:
   a substrate comprising a substrate body comprising a main surface in which a root mean square slope, RΔq, of a roughness curve is 0.12 or less, and wherein, in the substrate, an arithmetic mean roughness, Ra, of the roughness curve of the main surface is 2 nm or less; and
   a superconducting layer, on the main surface of the substrate, comprising an oxide superconductor.

2. The superconducting thin film of claim 1, wherein the oxide superconductor comprises $(RE)Ba_2Cu_3O_{7-\delta}$, where (RE) is a rare earth element.

3. The superconducting thin film of claim 2, wherein (RE) is at least one element selected from the group consisting of Y, Nd, Sm, Eu, Gd, Dy, Ho, Er, Tm, Yb and Lu.

4. The superconducting thin film of claim 1, further comprising:
   an intermediate layer between the substrate and the superconducting layer.

5. The superconducting thin film of claim 1, wherein the root mean square slope, RΔq, of the roughness curve of the main surface is 0.01 to 0.12.

6. The superconducting thin film of claim 1, wherein the superconducting layer comprises the oxide superconductor in an amount of 90% or more.

7. The superconducting thin film of claim 1, wherein the oxide superconductor is a copper oxide superconductor.

8. The superconducting thin film of claim 1, wherein the oxide superconductor comprises at least one copper oxide superconductor selected from the group consisting of:
   $(RE)Ba_2Cu_3O_{7-\delta}$, where (RE) is a rare earth element;
   $Bi_2Sr_2CaCu_2O_{8+\delta}$, optionally doped with Pb at one or more Bi sites;
   $Bi_2Sr_2Ca_2Cu_3O_{10+\delta}$, optionally doped with Pb at one or more Bi sites;
   $(La, Ba)_2CuO_{4-\delta}$;
   $(Ca, Sr)CuO_{2-\delta}$, optionally with one or more Ca sites replaced by Ba;
   $(Nd, Ce)_2CuO_{4-\delta}$;
   $(Cu, Mo)Sr_2(Ce, Y)_sCu_2O$, wherein s is 1, 2, 3 or 4;
   $Ba(Pb, Bi)O_3$; and
   $Tl_2Ba_2Ca_{n-1}Cu_nO_{2n+4}$, wherein n is an integer of 2 or more.

9. The superconducting thin film of claim 1, wherein the oxide superconductor comprises $YBa_2Cu_3O_{7-\delta}$.

* * * * *